US012154633B2

(12) United States Patent
Lee et al.

(10) Patent No.: US 12,154,633 B2
(45) Date of Patent: Nov. 26, 2024

(54) INPUT/OUTPUT PAD SUITABLE FOR MEMORY AND METHOD OF CONTROLLING SAME

(71) Applicant: DB HiTek Co., Ltd., Bucheon-si (KR)

(72) Inventors: Sang Mok Lee, Incheon (KR); Joon Tae Jang, Seoul (KR); Seung Hoo Kim, Seoul (KR); Ji Eon Kim, Bucheon-si (KR)

(73) Assignee: DB HiTek, Co., Ltd., Bucheon-si (KR)

( * ) Notice: Subject to any disclaimer, the term of this patent is extended or adjusted under 35 U.S.C. 154(b) by 240 days.

(21) Appl. No.: 18/046,995

(22) Filed: Oct. 17, 2022

(65) Prior Publication Data

US 2023/0127577 A1  Apr. 27, 2023

(30) Foreign Application Priority Data

Oct. 22, 2021 (KR) .................. 10-2021-0141733

(51) Int. Cl.
*G11C 16/22* (2006.01)
(52) U.S. Cl.
CPC ............................. *G11C 16/225* (2013.01)
(58) Field of Classification Search
CPC .................................................. G11C 16/225
USPC ................................................... 365/185.04
See application file for complete search history.

(56) References Cited

U.S. PATENT DOCUMENTS

| 5,835,328 A * | 11/1998 | Maloney ............... H02H 9/046 361/111 |
| 2008/0316660 A1* | 12/2008 | Huang ................... H02H 9/046 361/56 |
| 2009/0168280 A1* | 7/2009 | Huang ................... H02H 9/046 361/56 |
| 2020/0051652 A1* | 2/2020 | Jeong ..................... H02H 9/046 |

FOREIGN PATENT DOCUMENTS

KR   10-1999-0065061 A   8/1999

* cited by examiner

*Primary Examiner* — Anthan Tran
(74) *Attorney, Agent, or Firm* — Andrew D. Fortney; Central California IP Group, P.C.

(57) ABSTRACT

An input/output circuit for a memory and a method of controlling the same are disclosed. The input/output circuit and the method of controlling the same are configured to prevent a memory element from being falsely or incorrectly programmed due to an ESD pulse. More particularly, the input/output circuit and the method of controlling the same include an ESD detection unit configured to detect a programming voltage or an ESD pulse on a pad terminal, a control logic unit configured to transmit a first voltage or a second voltage according to the programming voltage and the ESD pulse, and a switch unit configured to perform a turn-on or turn-off operation according to the first voltage or the second voltage.

9 Claims, 3 Drawing Sheets

INPUT/OUTPUT PAD SUITABLE FOR MEMORY AND METHOD OF CONTROLLING SAME

CROSS REFERENCE TO RELATED APPLICATION

The present application claims priority to Korean Patent Application No. 10-2021-0141733, filed Oct. 22, 2021, the entire contents of which are incorporated herein for all purposes by this reference.

BACKGROUND OF THE INVENTION

Field of the Invention

The present disclosure relates to an input/output circuit suitable for a memory and a method of controlling the same, which are configured to prevent one or more elements in the memory from performing a false programming operation due to an ESD pulse and, more particularly, to an input/output circuit and a method of controlling the same, including an ESD detection unit configured to detect a programming (e.g., VPP) voltage or an ESD pulse (e.g., on a pad terminal of the input/output circuit); a control logic unit configured to transmit a first voltage or a second voltage according to the programming voltage and the ESD pulse; and a switch unit configured to perform a turn-on or turn-off operation according to the first voltage or the second voltage.

Description of the Related Art

An integrated circuit implemented by a semiconductor may include at least one function block that performs a predetermined function, storage media used by the function blocks, and a CPU that controls the function blocks. The CPU, functional blocks, and storage media are operated using external power supplied to the integrated circuit. In addition, control signals supplied from the outside and used for the integrated circuit to perform predetermined functions and signals generated in response to the control signals are output to the outside.

An input/output (I/O) circuit refers to a circuit that serves as a path to receive external signals and power, as well as transmit internal signals from the integrated circuit to the outside.

Such an I/O circuit may include an ESD protection circuit. The reason for including the ESD protection circuit is that an ESD pulse may flow through an I/O pad due to an electrostatic discharge (ESD) event that occurs occasionally, causing damage to the integrated circuit, various elements, etc., in the absence of the ESD protection circuit. Accordingly, such vulnerability to ESD and other events has created a need for the ESD protection circuit, which is often added to an essential design element of IC chips.

As an example, the ESD protection circuit may also prevent a false programming operation in a memory element. FIG. 1 is a diagram illustrating such an I/O circuit for a non-volatile memory. Hereinafter, with reference to FIG. 1, a structure and problems of a general I/O circuit will be described.

Referring to FIG. 1, the I/O circuit includes a protection circuit 20 and a non-volatile memory 30 such as an Erasable Programmable Read Only Memory (EPROM). The protection circuit 20 includes a pad terminal 22; a resistor R1 for limiting current; and a switching element 26, such as an NMOS transistor connected between the pad terminal 22 and the resistor R1. Such a pad terminal 22 is a terminal for supplying a programming voltage, and the programming voltage is supplied through this terminal so as to program the memory 30.

The I/O circuit supports a programming mode and an ESD shunting mode. The programming mode is a mode for programming data in the memory 30. The programming mode is performed when a programming voltage (e.g., VPP) is applied through the pad terminal 22. However, even in the program mode, an ESD pulse or current may be applied through the pad terminal 22, and due to the ESD pulse or current, the memory 30 may be damaged. The resistor R1 for limiting the current in FIG. 1 serves to block such an ESD pulse or current. That is, the resistor R1 allows the ESD pulse or current to be discharged to a ground potential (e.g., the VSS terminal) through a discharge path, that is, through the switching element 26. Accordingly, the memory 30 may be prevented from performing a false programming operation due to the ESD pulse or current.

However, a portion of the ESD pulse or current may flow through the resistor R1, whereby the resistor R1 may not completely block the ESD pulse or current flowing into the memory 30. Therefore, the memory may falsely or incorrectly program the memory due to the ESD pulse or current.

In order to solve the above problem, the present inventor conceived a novel I/O circuit for a memory and a method of controlling the same, having an improved structure.

Documents of Related Art

Korean Patent Application Publication No. 10-1999-0065061, entitled "INPUT/OUTPUT TERMINAL CIRCUIT HAVING BIDIRECTIONAL PAD."

SUMMARY OF THE INVENTION

The present disclosure is devised to solve the problems of the related art, and an objective of the present disclosure is to provide an I/O circuit for a memory and a method of controlling the same, which enable prevention of one or more elements of the memory from being falsely or incorrectly programmed even when an ESD pulse occurs at a corresponding I/O pad.

In addition, another objective of the present disclosure is to provide an I/O circuit for a memory and a method of controlling the same, which prevent an element of the memory from performing a false programming operation according to an ESD pulse.

The present disclosure may be implemented by exemplary embodiments having one or more of the following configurations in order to achieve one or more of the above-described objectives.

According to an exemplary embodiment of the present disclosure, an input/output (I/O) circuit according to the present disclosure includes an ESD detection unit including a first (or second) switch configured to provide a first voltage or a second voltage according to a programming voltage or an ESD pulse on a pad terminal (e.g., an I/O pad of the I/O circuit); a control logic unit comprising a plurality of (second) switches configured to transmit the first voltage or the second voltage; a switch unit including a third (or seventh) switch configured to be turned on by the first voltage from the control logic unit; and a memory connected to the third (or seventh) switch, wherein the programming voltage is applied to the memory when the third (or seventh) switch is on, and the programming voltage is blocked from the memory when the third (or seventh) switch is off.

According to another exemplary embodiment of the present disclosure, in the input/output circuit according to the present disclosure, the switch unit may further include a fourth (or an eighth) switch connected to the third (or seventh) switch and turned on by the second voltage, and the fourth (or eighth) switch is turned on when a source terminal is connected to a ground terminal and the ESD pulse is present, so as to limit a voltage rise of a voltage supply node of the memory to a ground voltage.

According to yet another exemplary embodiment of the present disclosure, in the input/output circuit according to the present disclosure, the control logic unit may include a fifth (or a third) switch and a sixth (or a fifth) switch, which are turned on by the first voltage; and a seventh (or a fourth) switch and an eighth (or a sixth) switch, which are turned on by the second voltage.

According to still another exemplary embodiment of the present disclosure, in the input/output circuit according to the present disclosure, the first (or second) switch, the fifth (or third) switch, the sixth (or fifth) switch, and the (or third switch may be or comprise PMOS transistors, and the (or seventh switch, the (or eighth switch, and the (or fourth switch may be or comprise NMOS transistors.

According to still another exemplary embodiment of the present disclosure, in the input/output circuit according to the present disclosure, the ESD detection unit may further include a first (or second) resistor connected to the first (or second) switch, wherein the first (or second) switch is configured to delay a voltage rise of a gate terminal when the ESD pulse is on the pad terminal, and the first (or second) resistor is configured to delay a voltage drop of the gate terminal when the ESD pulse is on the pad terminal.

According to still another exemplary embodiment of the present disclosure, in the input/output circuit according to the present disclosure, the switch unit may further include a second (or third) resistor connected between the pad terminal and the third (or seventh) switch; and a third (or fourth) resistor connected between the third (or seventh) switch and the fourth (or eighth) switch.

According to still another exemplary embodiment of the present disclosure, in the input/output circuit according to the present disclosure, the second (or third) resistor and the third (or fourth) resistor may be configured to limit the ESD pulse or current between the pad terminal and the ground terminal.

According to still another exemplary embodiment of the present disclosure, an input/output circuit according to the present disclosure includes a detection unit configured to detect a signal on a pad terminal; and a switch unit comprising a first (or third, or seventh) switch configured to be turned on or turned off according to a programming voltage and an ESD pulse as detected by the detection unit, wherein when the first (or third, or seventh) switch is on, a memory is programmed with the programming voltage, and when the first (or third, or seventh) switch is off, the programming voltage is blocked from the memory.

According to still another exemplary embodiment of the present disclosure, in the input/output circuit according to the present disclosure, the switch unit may further include a second (or a fourth, or an eighth switch connected to the (or third switch, and the (or fourth switch is configured to be turned on when the ESD pulse is present, so as to limit a voltage rise of a voltage supply node of the memory to a ground voltage.

According to still another exemplary embodiment of the present disclosure, in the input/output circuit according to the present disclosure, the switch unit may further include a first (or a second, or a third) resistor and a second (or a third, or a fourth) resistor, which limit a current flow of the ESD pulse between the pad terminal and the ground terminal, the first (or second or third) resistor is connected between the pad terminal and the first (or third or seventh) switch, and the second (or third or fourth) resistor is connected between a drain of the first (or third or seventh) switch and a drain of the second (or fourth or eighth) switch.

According to still another exemplary embodiment of the present disclosure, in the input/output circuit according to the present disclosure, the detection unit may include a third (or a first, or a second) switch and a third (or a first, or a second) resistor, which are connected in series between the pad terminal and the ground terminal, and a gate terminal of the third (or a first, or second) switch is configured to generate voltage values different from each other according to the programming voltage or the ESD pulse.

According to an exemplary embodiment of the present disclosure, a method of controlling an input/output circuit for a memory includes detecting a programming voltage on a pad terminal; transmitting a voltage value of a first node to a second node when the programming voltage is present; and turning on a first (or a third, or a seventh) switch according to a voltage value of the second node and programming the memory with the programming voltage.

According to another exemplary embodiment of the present disclosure, in the method of controlling the input/output circuit, the voltage value may be a ground voltage.

According to yet another exemplary embodiment of the present disclosure, a method of controlling an input/output circuit for a memory includes transmitting a voltage value of a first node to a second node when an ESD pulse is on a pad terminal; and blocking a programming voltage from being supplied to the memory by turning off a first (or a third, or a seventh) switch according to a voltage value of the second node.

According to still another exemplary embodiment of the present disclosure, in the method of controlling the input/output circuit for the memory, the voltage value (e.g., on the first node and/or the second node) may be a programming voltage.

According to still another exemplary embodiment of the present disclosure, the method of controlling the input/output circuit for the memory may further include turning on a second (or a fourth, or an eighth) switch according to the voltage value of the first node, wherein a voltage rise of a voltage supply node of the memory is limited to a ground voltage.

According to still another exemplary embodiment of the present disclosure, in the method of controlling the input/output circuit for the memory, a third (or the first or second) switch connected to the pad terminal may increase a first node voltage to the programming voltage after a predetermined time delay, and the first node voltage is lower than a programming voltage when the ESD pulse is present.

According to still another exemplary embodiment of the present disclosure, in the method of controlling the input/output circuit for the memory, a first resistor connected between the ground terminal and the gate terminal of the third (or first or second) switch connected to the pad terminal may delay a voltage drop of the first node when the ESD pulse is present.

The present disclosure has the following effects by the above-described configuration.

According to the present disclosure, the memory is normally programmed according to a turn-on operation of a switch when a programming voltage is applied, and the programming voltage is blocked from the memory according to a turn-off operation of the switch when an ESD pulse is present, thereby preventing the memory from performing the false programming operation or being incorrectly programmed.

In addition, according to the present disclosure, even when a portion of current flows into the memory, the current may be limited to a ground voltage, thereby further preventing the memory from being falsely or incorrectly programmed.

DETAILED DESCRIPTION OF THE INVENTION

Hereinafter, one or more exemplary embodiments of the present disclosure will be described in detail with reference to the accompanying drawings. The exemplary embodiment(s) of the disclosure may be modified in various forms, and the scope of the present disclosure should not be construed as being limited to the following exemplary embodiment(s), but should be interpreted on the basis of the matters described in the claims. In addition, the present exemplary embodiment(s) may be only provided for reference in order to more completely describe the present disclosure to those skilled in the art.

As used herein, expression in the singular form may also include expression in plural forms, unless the context clearly indicates otherwise. In addition, as used herein, "comprise" and/or "comprising" specify the presence of the recited shapes, numbers, steps, operations, members, elements, and/or groups thereof, and does not exclude the presence or addition of one or more other shapes, numbers, operations, members, elements and/or groups thereof. In addition, terms to be described later are terms defined in consideration of functions in the present disclosure, which may vary according to the intention or custom of users or operators.

In addition, in the following, similar or identical components may be distinguished by number labels such as "first," "second," etc., but a second component does not necessarily presuppose a first component, and each component may be independent from others.

Hereinafter, an I/O circuit for a memory according to one or more exemplary embodiments of the present disclosure will be described in detail with reference to the accompanying drawings.

Figure 1:
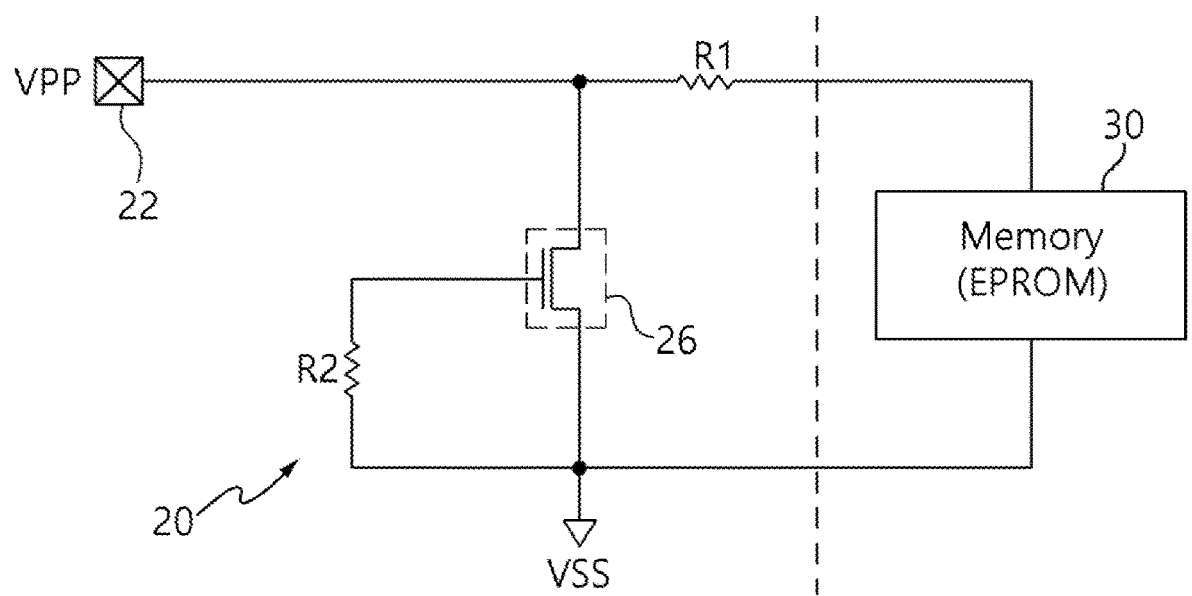
FIG. 1 is a block diagram illustrating an I/O circuit for a memory according to the related art.
Figure 2:
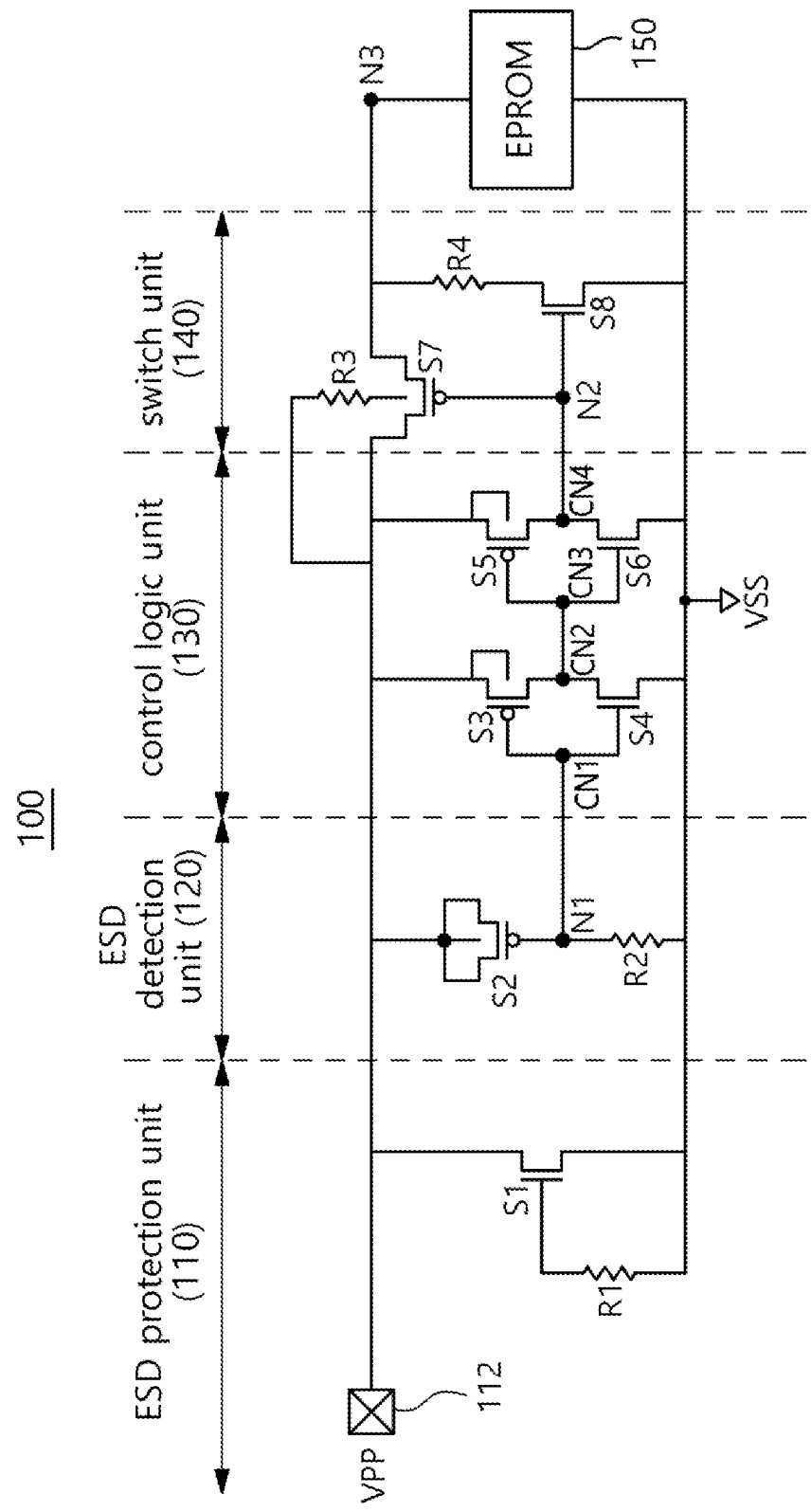
FIG. 2 is a circuit diagram illustrating an I/O circuit for a memory according to an exemplary embodiment of the present disclosure.

FIG. 2 is a configuration diagram illustrating the I/O circuit according to exemplary embodiment(s) of the present disclosure.

The I/O circuit 100 according to exemplary embodiment(s) of the present disclosure operates in a first operation mode (i.e., a programming mode) and a second operation mode (i.e., an ESD shunting mode), and such first and second operation modes are driven differently depending on levels or values of ESD sensing signals (e.g., in the I/O circuit 100).

Referring to FIG. 2, the I/O circuit 100 may include an ESD protection unit 110, an ESD detection unit 120, a control logic unit 130, and a switch unit 140. An integrated circuit including the I/O circuit 100 may further include a memory (i.e., an EPROM) 150 receiving an input signal or programming voltage from the I/O circuit 100, and in one or more embodiments, provide an output signal (e.g., data) to the I/O circuit 100.

The ESD protection unit 110 includes a first switch S1 configured to discharge an ESD pulse occurring on a pad terminal 112 to a VSS terminal (i.e., a ground terminal), and a first resistor R1. The first switch S1 is an NMOS transistor, and the first resistor R1 is connected between a gate terminal of the first switch S1 and the VSS terminal. In addition, as described above, the pad terminal 112 may be a terminal configured to supply a program voltage VPP in order to program the memory 150. The programming voltage, which may be in the range of 5-12 V, may be higher than a typical operating voltage for reading the memory (e.g., VCC, which may be in the range of 1.8-5 V).

The ESD detection unit 120 may include a second switch S2 and a second resistor R2, which may be connected in series between the pad terminal 112 and the VSS terminal. The second switch S2 comprises a PMOS transistor, and may be configured as a capacitor. A first node N1 (i.e., a gate terminal node of the capacitor-configured PMOS transistor S2) of the ESD detection unit 120 detects a first voltage value or a second voltage value. The first and second voltage values are generally different from each other, and may respectively correspond to a programming voltage (e.g., as described above) or an ESD pulse, which may be present on the pad terminal 112, thereby allowing the first operation mode and the second operation mode as described above to be performed. ESD pulses typically have a value in the range of hundreds to tens of thousands of volts.

In addition, the second switch S2 and the second resistor R2 also function to delay a voltage rise and a voltage drop for a predetermined time in the ESD shunting mode. For example, the second switch S2 may operate as a capacitor in the second operation mode.

The control logic unit 130 serves to transmit a first voltage or a second voltage to the switch unit 140 according to a detection signal of the ESD detection unit 120. To this end, the control logic unit 130 includes, between the pad terminal 112 and the VSS terminal, a third switch S3 and a fourth switch S4 connected in series, and a fifth switch S5 and a sixth switch S6 connected in series. Between the pad terminal 112 and the VSS terminal, the third switch S3 and fourth switch S4, and the fifth switch S5 and sixth switch S6 may be connected in parallel. A first common node CN1 to which gate terminals of the third switch S3 and the fourth switch S4 are connected is connected to the first node N1 of the second switch S2, and a second common node CN2 to which drain terminals are connected is connected to a third common node CN3 to which gate terminals of the fifth switch S5 and the sixth switch S6 are connected. The fourth common node CN4 to which drain terminals of the fifth switch S5 and the sixth switch S6 are connected is connected to a second node N2 of the switch unit 140.

In addition, for example, the third switch S3 and the fifth switch S5 may be PMOS transistors, and the fourth switch S4 and the sixth switch S6 may be NMOS transistors. The above-described switches are turned on or turned off according to a VSS level or a VPP level to form a path for transmitting voltages or a voltage level or value. The third switch S3 and the fourth switch S4 may function as a first inverter, and the fifth switch S5 and the sixth switch S6 may function as a second inverter in series with the first inverter. Together, the third switch S3, the fourth switch S4, the fifth switch S5 and the sixth switch S6 may function as a buffer.

The switch unit 140 includes a seventh switch S7 that comprises a PMOS transistor and an eighth switch S8 that comprises an NMOS transistor. A drain terminal of the seventh switch S7 and a drain terminal of the eighth switch S8 are connected to each other, and gate terminals of both switches S7 and S8 are connected to the second node N2. In addition, the second node N2 and the fourth common node CN4 are connected to each other. In addition, a third resistor R3 is connected between the pad terminal 112 and the seventh switch S7, and a fourth resistor R4 is connected to a drain terminal of the eighth switch S8. The third resistor R3 and the fourth resistor R4 serve to limit an ESD pulse or current flow between the VPP terminal and the VSS terminal.

The memory 150 may comprise an EPROM and may be programmed when a programming voltage is supplied to a third node N3, which may be a VPP voltage supply node. Alternatively, the memory 150 may comprise a one-time programmable (OTP) EPROM, an electrically erasable programmable read only memory (EEPROM), or a flash EPROM or EEPROM (e.g., a flash memory).

As described above, the I/O circuit 100 of the present disclosure configured as such can be driven in the first operation mode (i.e., the programming mode) and separately in the second operation mode (i.e., the ESD shunting mode), and hereinafter, each operation mode will be described in detail.

First, a case of operating the I/O circuit in the programming mode, which is the first operation mode, will be described. The first operation mode refers to a case in which a programming voltage is present on the pad terminal 112. In one or more exemplary embodiments, the programming voltage may have a rising time with a gentler (smaller) slope than that of a positive (+) ESD pulse.

When the programming voltage is applied, the voltage of the first node N1 connected to the gate terminal of the second switch S2 has a VSS voltage (i.e., a low level or ground potential, about 0 V). In addition, when the first node N1 maintains a low level or zero voltage value, the third switch S3 of the control logic unit 130 is on, and the fourth switch S4 is off. In turn, the fifth switch S5 of the control logic unit 130 is off, and the sixth switch S6 is on. According to such operation, the low level or zero voltage value of the first node N1 is transmitted to the second node N2.

In addition, according to the low level of the second node N2, the seventh switch S7, which is a PMOS transistor, is turned on, and the eighth switch S8, which is an NMOS transistor, is turned off. The programming voltage present on the pad terminal 112 is supplied to the third node N3 of the EPROM 150 when of the switch S7 is on, whereby one or more cells, rows, sections or blocks of the EPROM 150 can be programmed.

As such, when the programming voltage is present on the pad terminal 112, the EPROM 150 may be programmed by the programming voltage supplied to the third node N3 of the EPROM 150.

Hereinafter, the second operation mode will be described as a case in which an ESD pulse occurs on the pad terminal 112.

The ESD pulse is present on the pad terminal 112. In exemplary embodiments of the present disclosure, the ESD pulse has a rising time with a slope that is greater than that of the programming voltage in the programming mode.

When the ESD pulse is present on the pad terminal 112, the second switch S2 increases the voltage on the first node N1. The voltage on the first node N1 may be the same voltage as the programming voltage, which may be increased by the ESD pulse. In this case, the voltage on the first node N1 does not immediately rise to the programming voltage, but the second switch S2, which is a PMOS transistor configured to operate as a capacitor, may delay the increase in the voltage on the first node N1 to some extent. In addition, the current flowing in through the second switch S2 may excessively flow to the VSS terminal as well. The excessive current may be prevented because the second resistor R2 delays a voltage drop on the first node N1.

The voltage on the first node N1 reaches a programming voltage or other, similar value (i.e., a high level) sufficient to turn on the fourth switch S4 and turn off the fifth switch S5. In turn, the fifth switch S5 of the control logic unit 130 turns on, and the sixth switch S6 turns off. According to such operation, the level or value of the first node N1 is transmitted to the second node N2, and the second node N2 has a high logic state or high voltage level.

The seventh switch S7 is turned off by the high level or state on the second node N2. Accordingly, the programming or other voltage on the pad terminal 112 is blocked from the EPROM 150. Naturally, even in this case, current may be applied to the third node N3 of the EPROM 150 (e.g., through a parasitic capacitor formed in or by the seventh switch S7 for a predetermined time before the seventh switch S7 is completely turned off). However, since the eighth switch S8 is turned on by the high logic level on the second node N2, the current may be discharged to the VSS terminal. Accordingly, the voltage on the third node N3 may be reduced to the VSS voltage (or at least less than the programming voltage). This means that a voltage sufficient for programming cannot be supplied to the EPROM 150, and thus the EPROM 150 cannot be falsely or incorrectly programmed when the I/O circuit 100 is in the ESD shunting mode.

Compared with the related art, the memory may be falsely programmed in the related art due to a voltage rise without completely blocking or shunting some of the current flowing from the pad terminal, but since the present disclosure completely blocks the programming voltage, and also limit the VSS voltage rise to the VSS voltage or less even though some current flows in, the EPROM 150 is fundamentally prevented from being falsely programmed.

Figure 3:
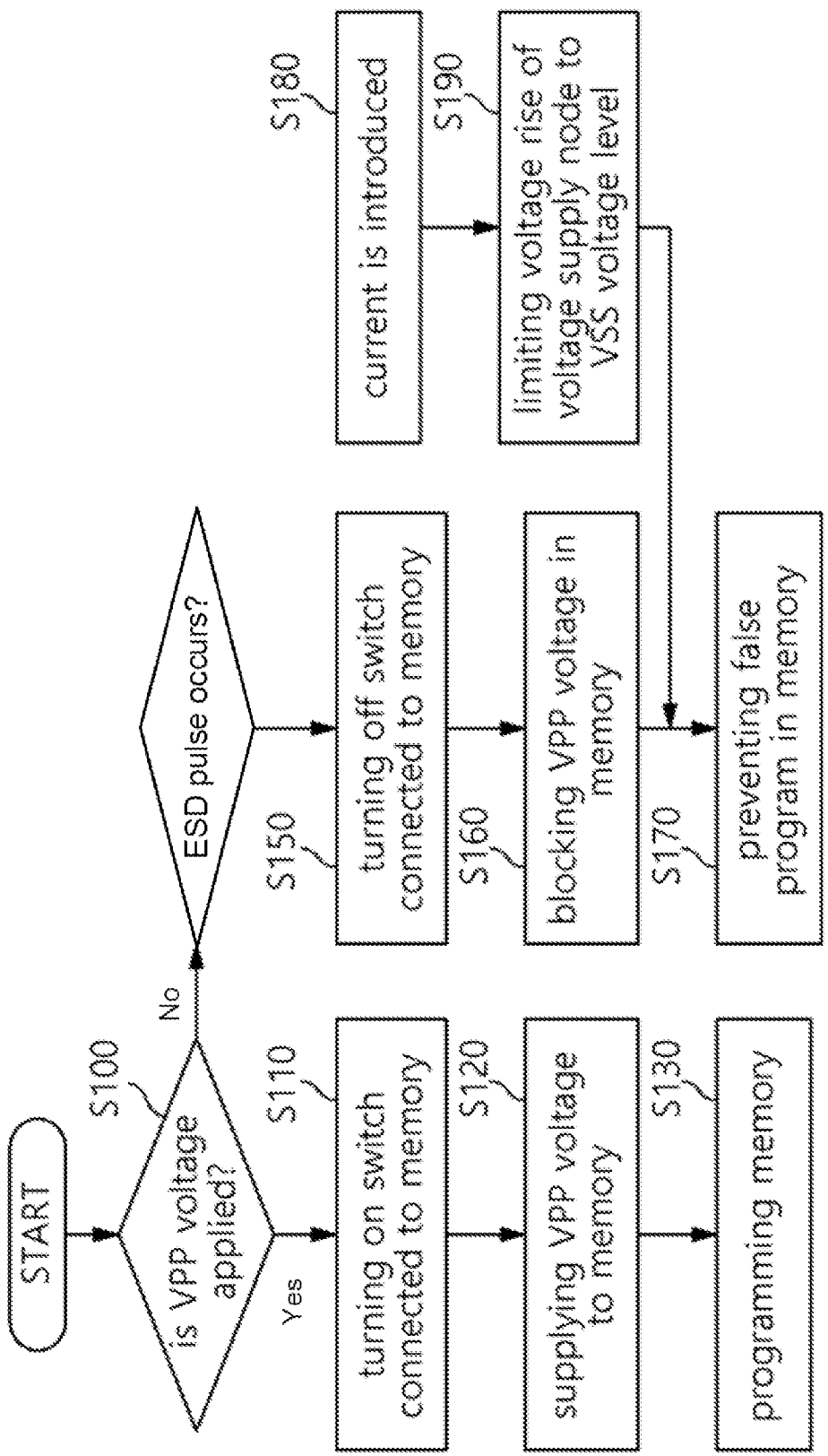
FIG. 3 is a flowchart illustrating a method of controlling an I/O circuit for a memory according to the exemplary embodiment of the present disclosure.

FIG. 3 is a flowchart illustrating a method of controlling an I/O circuit for a memory according to one or more exemplary embodiments of the present disclosure.

Referring to FIGS. 2 and 3, whether a programming voltage or an ESD pulse is on a pad terminal 112 is determined in step S100. The voltage on the pad terminal 112 is determined at least in part by a voltage level or value on a first node N1.

So, when the programming voltage is on the pad terminal 112, a switch S7 (e.g., a first, third or seventh switch), which may supply or block the voltage on the pad terminal 112, is turned on in step S110. When the switch S7 is on, the programming voltage is applied to an EPROM 150 in step S120, and the EPROM 150 is programmed in step S130.

Whereas, when the ESD pulse occurs on the pad terminal 112 in step S140, the switch S7 is turned off in step S150, and the switch S7 cuts off the voltage on the pad terminal 112 from the memory 150 in step S160. In step S170, programming is prevented from occurring in the EPROM 150 (e.g., false programming is prevented) due to the voltage being cut off by the switch S7.

In addition, a current may also flow (e.g., from the pad terminal 112) before the switch S7 is turned off through a parasitic capacitor in the switch S7 in step S180, but in this case, since another switch S8 (i.e., a fourth or an eighth switch) connected to the VSS terminal is turned on, a voltage rise or increase on a third node N3 may be limited to the VSS voltage (or at least between the VSS voltage and the VCC voltage) in step S190. Therefore, since the voltage on the node N3 is insufficient to program the EPROM 150, the EPROM 150 may be prevented from being falsely or incorrectly programmed in step S170.

In this way, when the ESD pulse is applied, the false programming operation of the EPROM 150 may be fundamentally prevented in any case according to the present disclosure.

Meanwhile, in the present disclosure, as shown in FIG. 2, the ESD protection unit 110 is configured in a pad terminal region. Therefore, when the ESD pulse occurs, the ESD pulse may be primarily discharged to the VSS terminal (i.e., the ground terminal) through the first switch S1. As such, problems that may occur, such as damage to various elements due to the ESD pulse, may be more effectively prevented.

The above detailed description is illustrative of the present disclosure. In addition, the above description shows and describes embodiments of the present disclosure, and the present disclosure may be used in various other combinations, modifications, and environments. That is, changes or modifications may be made within the scope of the concept of the disclosure in the present specification, the scope equivalent to the disclosed contents described previously, and/or the scope of the skill or knowledge of the art. The above-described exemplary embodiments are to describe the best state for implementing the technical idea of the present disclosure, and various modifications for specific applications or fields and use of the present disclosure are possible. Therefore, the detailed description of the present disclosure is not intended to limit the present disclosure to the disclosed embodiments.

What is claimed is:

1. An input/output circuit, comprising:
an ESD detection unit comprising a first switch configured to provide a first voltage or a second voltage according to a programming voltage or an ESD pulse on a pad terminal;
a control logic unit comprising a plurality of second switches configured to transmit the first voltage or the second voltage;
a switch unit comprising a third switch configured to be turned on by the first voltage from the control logic unit, a first resistor connected between the pad terminal and the third switch, a fourth switch connected to the third switch and turned on by the second voltage, and a second resistor connected between the third switch and the fourth switch; and
a memory connected to the third switch,
wherein the programming voltage is applied to the memory when the third switch is on, and
the programming voltage is blocked from the memory when the third switch is off.

2. The input/output circuit of claim 1,
wherein the fourth switch is turned on when a source terminal is connected to a ground terminal and the ESD pulse is applied, so as to limit a voltage rise of a voltage supply node of the memory to a ground voltage.

3. The input/output circuit of claim 1, wherein the control logic unit comprises:
a fifth switch and a sixth switch, which are turned on by the first voltage; and
a seventh switch and an eighth switch, which are turned on by the second voltage.

4. The input/output circuit of claim 3, wherein the first switch, the fifth switch, the sixth switch, and the third switch are PMOS transistors, and
the seventh switch, the eighth switch, and the fourth switch are NMOS transistors.

5. The input/output circuit of claim 1, wherein the ESD detection unit further comprises a third resistor connected to the first switch, wherein
the third switch is configured to delay a voltage rise of a gate terminal when the ESD pulse is on the pad terminal, and
the third resistor is configured to delay a voltage drop of the gate terminal when the ESD pulse is on the pad terminal.

6. The input/output circuit of claim 1, wherein the second resistor and the third resistor are configured to limit the ESD pulse or current between the pad terminal and the ground terminal.

7. An input/output circuit, comprising:
a detection unit configured to detect a signal on a pad terminal; and
a switch unit comprising a first switch configured to be turned on or turned off according to a programming voltage and an ESD pulse, as detected by the detection unit, and a first resistor and a second resistor that limit a current flow of the ESD pulse between the pad terminal and the ground terminal,
wherein the when the first switch is on, a memory is programmed with the programming voltage, or when the first switch is off, the programming voltage is blocked from the memory,
the first resistor is connected between the pad terminal and the first switch, and
the second resistor is connected between a drain of the first switch and a drain of the second switch.

8. The input/output circuit of claim 7, wherein the switch unit further comprises a second switch connected to the first switch, and
the second switch is configured to be turned on when the ESD pulse is present, so as to limit a voltage rise of a voltage supply node of the memory to a ground voltage.

9. An input/output circuit, comprising:
a detection unit configured to detect a signal on a pad terminal; and
a switch unit comprising a first switch configured to be turned on or turned off according to a programming voltage and an ESD pulse, as detected by the detection unit,
wherein the when the first switch is on, a memory is programmed with the programming voltage, or when the first switch is off, the programming voltage is blocked from the memory,
the detection unit comprises a second switch and a first resistor, which are connected in series between the pad terminal and the ground terminal, and
a gate terminal of the second switch is configured to generate voltage values different from each other according to the programming voltage or the ESD pulse.

* * * * *